(12) United States Patent
Sako et al.

(10) Patent No.: US 7,000,171 B2
(45) Date of Patent: Feb. 14, 2006

(54) RECORDED MEDIUM REPRODUCING DEVICE AND METHOD, DATA OUTPUT CONTROLLING METHOD, DATA OUTPUTTING METHOD, ERROR DETECTING METHOD, AND DATA OUTPUTTING REPRODUCING METHOD

(75) Inventors: Yoichiro Sako, Tokyo (JP); Tatsuya Inokuchi, Kanagawa (JP); Tetsuji Kawashima, Kanagawa (JP)

(73) Assignee: Sony Corporation, Tokyo (JP)

( * ) Notice: Subject to any disclaimer, the term of this patent is extended or adjusted under 35 U.S.C. 154(b) by 634 days.

(21) Appl. No.: 10/069,198

(22) PCT Filed: Jun. 21, 2001

(86) PCT No.: PCT/JP01/05302

§ 371 (c)(1),
(2), (4) Date: Feb. 22, 2002

(87) PCT Pub. No.: WO01/99106

PCT Pub. Date: Dec. 27, 2001

(65) Prior Publication Data

US 2002/0122369 A1    Sep. 5, 2002

(51) Int. Cl.
*G11C 29/00* (2006.01)

(52) U.S. Cl. .................. 714/763; 714/758; 360/53

(58) Field of Classification Search ............. 714/763, 714/766, 773, 48, 52, 752, 785; 360/25, 360/27, 53, 31; 369/53.36, 59.25
See application file for complete search history.

(56) References Cited

U.S. PATENT DOCUMENTS

| | | | | |
|---|---|---|---|---|
| 4,394,763 A | * | 7/1983 | Nagano et al. | 714/6 |
| 4,910,736 A | * | 3/1990 | Tanaka et al. | 714/758 |
| 5,590,306 A | * | 12/1996 | Watanabe et al. | 711/115 |
| 5,617,429 A | * | 4/1997 | Goto | 714/736 |

* cited by examiner

*Primary Examiner*—Phung My Chung
(74) *Attorney, Agent, or Firm*—Jay J. Maioli

(57) ABSTRACT

A reproducing method for a record medium includes the steps of performing a demodulating process for data that have been read from a record medium on which content data have been recorded, management information and additional information being embedded in the content data, the management information being with respect to a copy management, the additional information containing one of error detection code and error correction code added to the management information, detecting the additional information from a demodulated output signal, performing an error detecting process corresponding to one of the error detection code and the error correction code, and controlling an output operation for the demodulated output signal for the content data read from the record medium corresponding to the management information when no error is found in the error detecting process.

56 Claims, 12 Drawing Sheets

SYNC:5555(h)

ID=0 : PAYLOAD

| OMD | | SCMS | |
|---|---|---|---|
| 0 0 : | ROM (PRE-PRESS) | 0 0 : | ORIGINAL |
| 0 1 : | R | 0 1 : | COPY |
| 1 0 : | RW | 1 1 : | COPY FREE |
| 1 1 : | ANY(ROM/R/RW) | | |

ID=1 : PACKET ODDSET offset_Info = 2450 − PACKET NUMBER

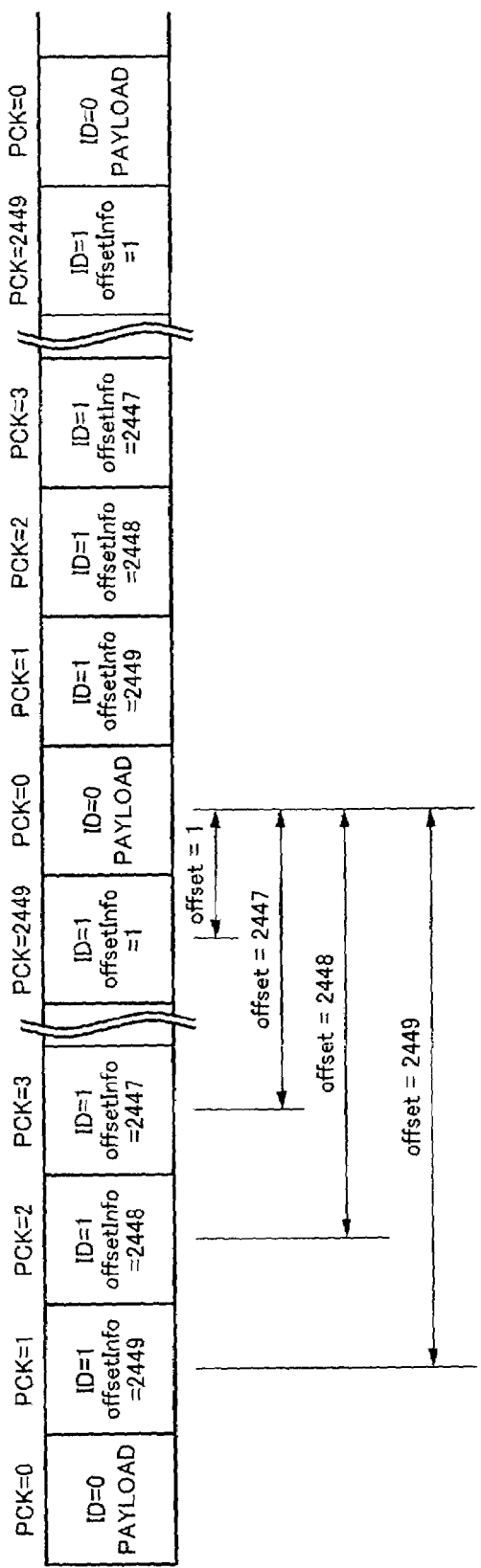

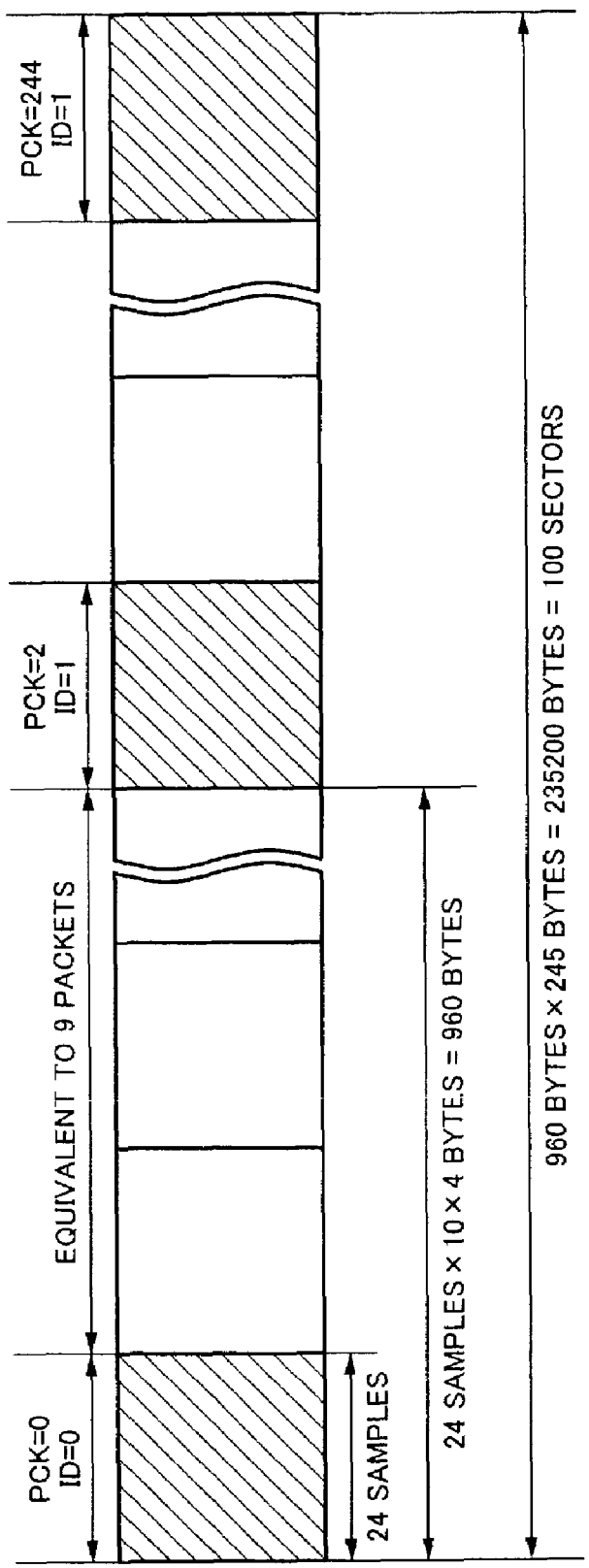

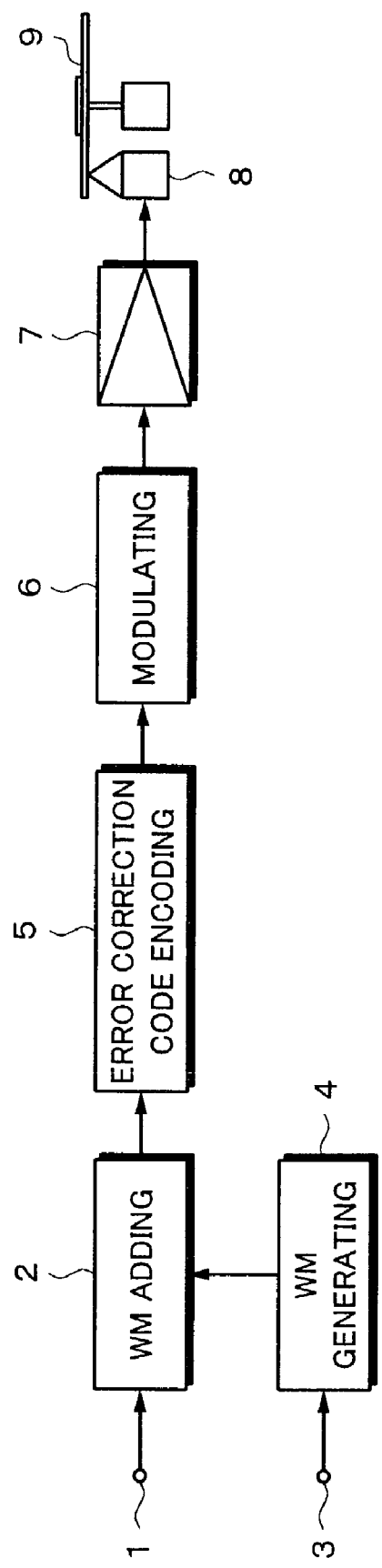

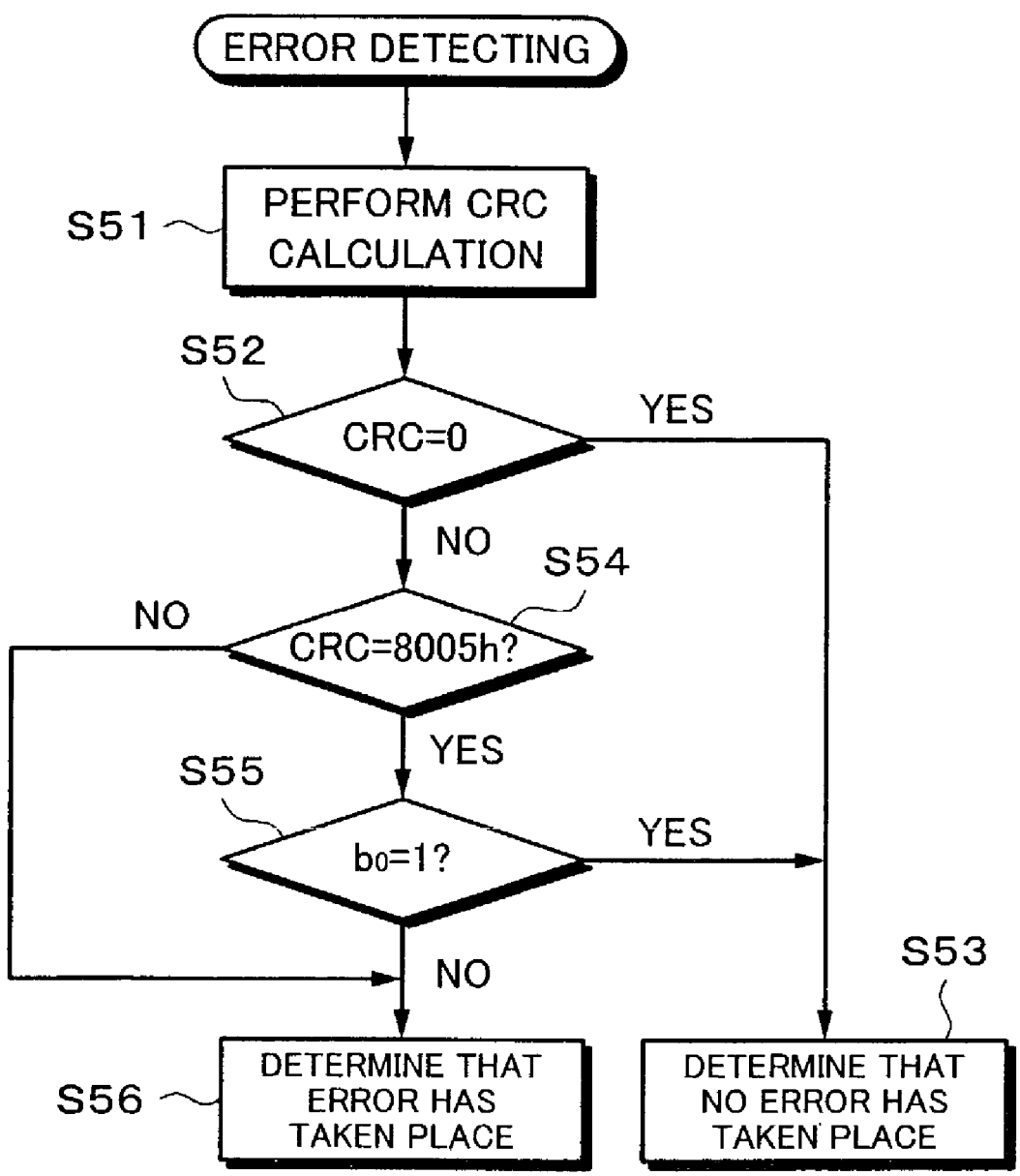

RECORDED MEDIUM REPRODUCING DEVICE AND METHOD, DATA OUTPUT CONTROLLING METHOD, DATA OUTPUTTING METHOD, ERROR DETECTING METHOD, AND DATA OUTPUTTING REPRODUCING METHOD

TECHNICAL FIELD

The present invention relates to a reproducing apparatus and a reproducing method for a record medium, a data output controlling method, a data outputting method, an error detecting method, and a data outputting and reproducing method suitable for data of a content in which additional information is embedded.

BACKGROUND ART

To protect the copyright of data of an audio content and a video content that are recorded to a record medium, a watermark of which copy management information as additional information is superimposed and embedded to the data of the contents has been developed. As an example of such a watermark, a method for inserting additional information into a low order bit of data of a content is known.

To protect the copyright of audio data, as copy management information embedded as a watermark to a content, SCMS (Serial Copy Management System) has been used. Using the SCMS copy management information, not only a copy management for allowing a copy operation to be freely performed and a copy management for prohibiting a copy operation, but a copy management in a plurality of generations can be performed.

To do that, data of a watermark is embedded to a low order bit of data of a content. The SCMS copy management information is recorded to data of the watermark.

However, when the copy management in a plurality of generations is performed using the SCMS copy management information, it is necessary to rewrite it.

For example, SCMS data is represented with information of two bits. When the SCMS data is "00", it represents that the record medium is an original record medium of which a copy operation can be performed in only one generation. When the SCMS data is "01", it represents that the record medium is a copied record medium of which a further copy operation is prohibited. When the SCMS data is "11", it represents that the record medium is a record medium of which a copy operation can be freely performed. When a copy operation is performed with a record medium of which the SCMS data is "00", the SCMS data is rewritten from "00" to "01" so that a copy operation can be performed in only one generation.

A process for rewriting such a watermark requires a larger load than a process for detecting such a watermark.

In addition, when a watermark is recorded, for example, CRC code added so that an error can be detected. When the SCMS data is changed (namely, rewritten), it is necessary to change the CRC code.

The applicant of the present patent application has proposed a technology of which data of a watermark is processed as a packet composed of 48 bits. In the packet, 16-bit error detection CRC code is added. In this case, to allow a copy operation in only one generation, when an original disc is copied, the SCMS data is rewritten from "00" to "01". At that point, in addition to the rewriting of the SCMS data, it is necessary to rewrite the 16-bit CRC code. Thus, the required load increases.

In particular, a technology of which a copy management using a watermark is performed by firmware accomplished by a program written in a ROM, not by a dedicated IC, has been desired. However, since the processing capacity of the firmware is very small, the process for rewriting the watermark imposes a large load on the firmware.

As was described above, when copy generations are managed, it is necessary to rewrite the watermark. When the watermark is rewritten, it is necessary to rewrite the CRC code, too. Thus, the process for rewriting the watermark imposes an excessive load to the firmware.

Thus, an object of the present invention is to provide a reproducing apparatus and a reproducing method for a record medium, a data output controlling method, a data outputting method, an error detecting method, and a data outputting and reproducing method that allow a management requiring the rewriting of a watermark embedded in a content to be sufficiently performed by firmware without need to rewrite error detection code and error correction code.

DISCLOSURE OF THE INVENTION

The present invention is a reproducing apparatus for a record medium, the reproducing apparatus comprising:
a head portion for scanning a record medium on which data of a content has been recorded, at least management information and additional information being embedded to the data of the content, the management information being with respect to a copy management, the additional information containing at least one of error detection code and error correction code added to the management information;
a demodulation processing portion for performing a demodulating portion for data that that has been read from the record medium by said header portion;
a detecting circuit portion for detecting the additional information from an output signal of said demodulation processing portion; and
a determining circuit portion for performing an error detecting process for a detected result supplied from said detecting circuit portion corresponding to the error detection code contained in the additional information detected by said detecting circuit portion and controlling an output operation for an output signal of said demodulation processing portion for the data of the content that has been read from the record medium corresponding to the management information when no error takes place in the error detecting process.

The present invention is a reproducing method for a record medium, the reproducing method comprising the steps of:
performing a demodulating process for data that has been read from a record medium on which data of a content has been recorded, at least management information and additional information being embedded to the data of the content, the management information being with respect to a copy management, the additional information containing at least one of error detection code and error correction code added to the management information;
detecting the additional information from an output signal of which the demodulation process has been performed;
performing an error detecting process corresponding to one of the error detection code and the error correction code of the detected additional information; and
controlling an output operation for an output signal of which the demodulating process has been performed for the data of the content that has been read from the record medium corresponding to the management information when no error takes place in the error detecting process.

The present invention is a data output controlling method, comprising the steps of:

detecting additional information from data of a content, at least management information and additional information being embedded to the data of the content, the management information being with respect to a copy management, the additional information containing at least one of error detection code and error correction code added to the management information;

performing an error detecting process corresponding to one of the error detection code and the error correction code of the detected additional information; and controlling an output operation for the data of the content corresponding to the management information when no error takes place in the error detecting process.

The present invention is a data outputting method, comprising the steps of:

when at least management information and additional information are embedded to data of a content and then output, the management information being with respect to a copy management, the additional information containing at least one of error detection code and error correction code added to the management information, rewriting the management information, adding one of the error detection code and the error correction code as it is to the rewritten management information, and outputting the resultant data.

The present invention is a data outputting and reproducing method, comprising the steps of:

when at least a part of data to which one of error detection code and error correction code has been added is rewritten, adding at least one of the error detection code and the error correction code to the data and outputs the resultant data;

pre-obtaining a syndrome in the case that at least a part of the data is rewritten;

when the data is reproduced, obtaining a syndrome corresponding to one of the error detection code and the error correction code; and detecting whether or not an error takes place corresponding to the obtained syndrome and the pre-obtained syndrome.

BRIEF DESCRIPTION OF DRAWINGS

FIG. 3 is a schematic diagram for explaining offset information;

FIG. 4 is a schematic diagram for explaining an arrangement of a watermark;

FIG. 7 is a block diagram showing an example of a recording apparatus according to the present invention;

FIG. 13 is a flow chart for explaining an error detection according to the present invention.

BEST MODES FOR CARRYING OUT THE INVENTION

Next, with reference to the accompanying drawings, an embodiment of the present invention will be described. According to the embodiment of the present invention, when data of a content is recorded to a record medium, data of a watermark is embedded to the data of the content.

Figure 1:
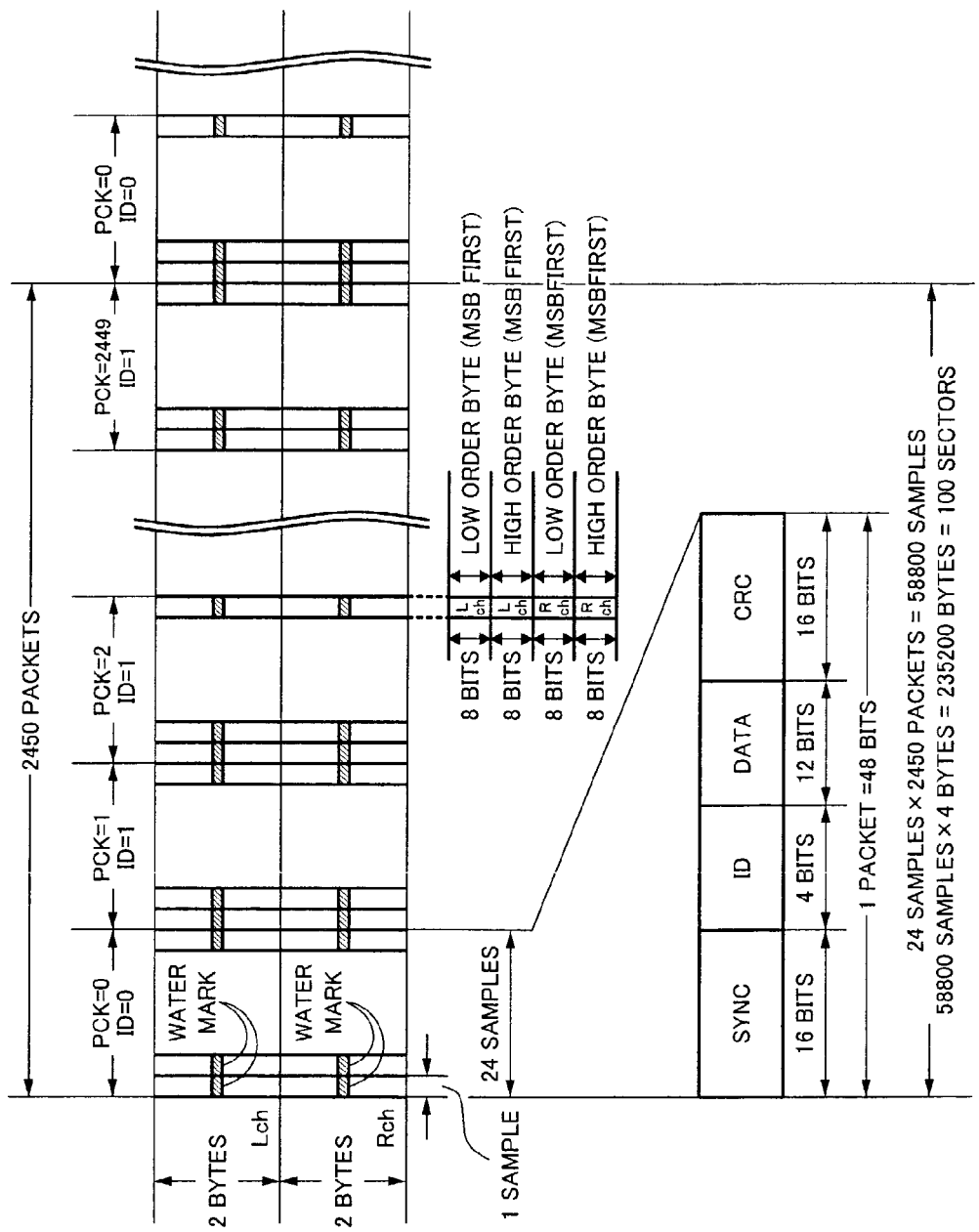
FIG. 1 is a schematic diagram for explaining data of a watermark.

FIG. 1 shows the structure of a watermark embedded in data of a content. Data of a content (in this example, audio data on left (L) channel and right (R) channel) is processed with two bytes (16 bits) per sample. Data of a watermark (hatched portions in FIG. 1) is embedded in the least significant bit of the data of the content. Thus, the data of the watermark is embedded to the data of the content in the ratio of two bits to one sample on each of left and right channels (2 bytes+2 bytes=4 bytes).

The data of the watermark is processed every 48 bits as one information unit (packet). The data of the watermark is embedded to the data of the content in the ratio of two bits to four bytes as one sample of each of left and right channels. Thus, one packet (48 bits) of the data of the watermark is embedded to 24 samples of each of left and right channels of the data of the content (24 samples×4 bytes=96 bytes).

As will be described later, there are two types of packets each of which is composed of 48 bits. The first type is a packet that describes a payload. The second type is a packet that represents a position of a packet that describes a payload. (Hereinafter, the first type packet is referred to as payload packet, whereas the second type packet is referred to as payload packet position representation packet.) To distinguish a payload packet from a payload packet position representation packet, an identifier ID is assigned. The identifier ID of a payload packet (ID=0). On the other hand, the identifier ID of a payload packet position representation packet is (ID=1). In this example, a packet with packet number PCK (PCK=0) is a payload packet (ID=0). A packet with packet number PCK (PCK=1 to 2449) is a payload packet position representation packet (ID=1). A payload packet (a packet with identifier ID (ID=0)) is placed at an interval of 2450 packets. Between two payload packets with identifier ID (ID=1), payload packet position representation packets (ID=1) are placed.

The data of one packet (48 bits) embedded as a watermark is composed of a sync of 16 bits, an identifier ID of four bits, data of 12 bits, and CRC code of 16 bits.

The sync is used to detect the beginning of the packet for synchronization. The sync has a fixed pattern of for example 5555h (where h represents hexadecimal notation).

The sync is followed by the identifier ID that identifies the type of the packet. As was described above, there are two types of packets. The first type is a payload packet (see FIG. 2B). The second type is a payload packet position representation packet (see FIG. 2C). The identifier ID of a payload packet is (ID=0), whereas the identifier ID of a payload packet position representation packet is (ID=1).

Figure 2A:
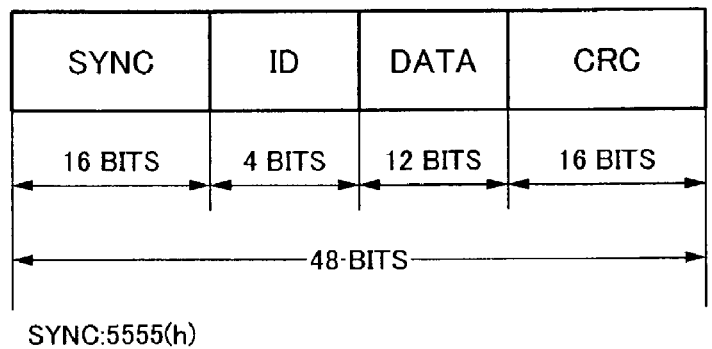
FIGS. 2A, 2B, and 2C are schematic diagrams for explaining a packet.
Figure 2B:
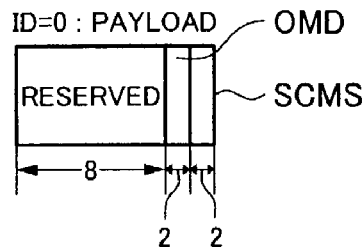
Figure 2C:
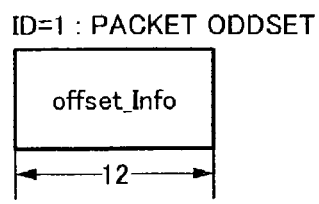

Alternatively, with a sync pattern rather than the identifier ID, a payload packet (see FIG. 2B) may be distinguished from a payload packet position representation packet (see FIG. 2C). For example, the sync pattern of the first type may be 5555h, whereas the sync pattern of the second type may be 9999h.

The identifier ID, which identifies the type of the packet, is followed by data. The structure of the data of a payload packet is different from the structure of the data of a payload packet position representation packet.

FIG. 2B shows the structure of the data of a payload packet (packet with ID=0). As shown in FIG. 2B, this packet describes a payload as data of 12 bits.

The first eight bits of the payload of 12 bits are reserved.

The next two bits are OMD (Original Media Discriminator) that identifies the type of an original record medium. When the OMD is "00", it represents that the original record medium is a read-only medium (CD (Compact Disc) or CD-ROM (CD-Read Only Memory)). When the OMD is "01", it represents that the original record medium is a read-once type record medium (CD-R (Compact Disc Recordable). When the OMD is "10", it represents that the original record medium is a recordable/reproducible record medium (CD-RW (Compact Disc Rewriter)). When the OMD is "11", it represents that the original record medium is any disc.

The OMD can be used to manage a charging process for a reproducing operation and so forth. When the original record medium is the same as a real record medium, since the original record medium is used, the charging process is not performed. When the original record medium is different from a real record medium, since a copied record medium is used, the charging process is performed for the reproducing operation. Thus, the charging process is performed depending on whether the record medium is an original record medium or a copied record medium. As a result, the profit of the copyright owner can be secured.

The next two bits are SCMS (Serial Copy Management System) data for managing copyright. When the SCMS data is "00", it represents that the disc is an original disc of which data of a content recorded thereon is permitted to be copied in only one generation. When the SCMS data is "01", it represents that the disc is a copied disc of which data of a content that is read therefrom is prohibited from being copied. When the SCMS data is "11", it represents that the disc is a disc of which data of a content that is read therefrom can be freely copied.

Using the SCMS, copy generations are managed as described above. When one record medium is copied to another record medium one time, the copy generation advances by one. Thus, to manage copy generations, whenever a copy operation is performed, it is necessary to rewrite the SCMS data. Thus, it can be stated that a payload packet (ID=0) is a packet that may have to be rewritten.

FIG. 2C shows the structure of data of a payload packet position representation packet (ID=1). The payload packet position representation packet describes offset information that represents the distance to a payload packet (Offset_Info).

In the example, as shown in FIG. 1, a payload packet (packet with ID=0) is placed at an interval of 2450 packets. A packet with packet number PCK (PCK=0) is a payload packet (packet with ID=0). A packet with packet number PCK (PCK=1 to 2449) is a payload packet position representation packet (packet with ID=1). Thus, offset information (Offset_Info) is represented as follows.

Offset_Info=2450−PCK

PCK: Packet number

It can be stated that a payload packet (ID=0) is a packet that may have to be rewritten, whereas a payload packet position representation packet (ID=1) is a packet not to be rewritten.

In FIG. 2A, error detection CRC code is added to data of one packet. As CRC, the following generation polynomial is used.

$G(x)=x^{16}+x^{15}+x^{2}+1$

As described above, data of a watermark is embedded as one packet of 48 bits to data of a content. 48 bits of one packet are equivalent to 24 samples (96 bytes) of data of a content. A payload packet (packet with ID=0) is placed at an interval of 2450 packets. Other packets (packets with ID=1) are pointers that represent a position of a payload packet.

When data of a watermark is decoded, it is extracted as data of one packet of 48 bits from the least significant bit of data of a content.

The identifier ID is detected from the data of the watermark that has been read so as to identify the type of the packet.

When the detected identifier ID is (ID=0), since the packet is a payload packet (see FIG. 2B), a process corresponding to the description of the packet is performed.

When the detected identifier ID is (ID=1), since the packet is a payload packet position representation packet (see FIG. 2C), offset information (Offset_Info) is read. Thus, a packet apart from the payload packet position representation packet by the distance corresponding to the offset information (Offset_Info) is read. Since the packet apart from the payload packet position representation packet by the distance corresponding to the offset information (Offset_Info) is a payload packet (see FIG. 2B), a process corresponding to the description of the payload packet is performed.

In other words, as shown in FIG. 3, a packet with packet number PCK (PCK=0) is a payload packet. The packet with packet number PCK (PCK=0) is assigned identifier ID (ID=0) that represents a payload packet. The payload of the packet contains OMD for identifying the type of the original record medium and SCMS data for copyright management.

The payload packet is followed by payload packet position representation packets. These packets are assigned packet numbers PCK (PCK=1 to 2449). These packets are assigned identifier ID (ID=1). Offset information (Offset_Info) is written to these packets. The offset information (Offset_Info) represents a position of a payload packet (packet with ID=0).

In other words, (2450−1=2449) as offset information (Offset_Info) to the next payload packet is written to a packet with packet number PCK (PCK=1). Likewise, (2450−2=2448) as offset information (Offset_Info) to the next payload packet is written to a packet with packet number PCK (PCK=2). Likewise, (2450−3=2447) as offset information to the next payload packet is written to a packet with packet number PCK (PCK=3).

Thus, when there is a payload packet position representation packet (packet with ID=1), there is a payload packet (packet with ID=0) at the position of which the packet number PCK of the payload packet position representation packet and the offset of the offset information (Offset_Info) are added.

Thus, in the example, data of a watermark is embedded as one packet of 48 bits to data of a content. One packet of 48 bits is equivalent to 24 samples (96 bytes) of data of a content. At an interval of 2450 packets, a payload packet (packet with ID=0) is placed. The other packets are payload packet position representation packets (packets with ID=1). A packet that may have to be rewritten is a payload packet (packet with ID=0). In contrast, payload packet position representation packets (packets with ID=1) are packets that do not have to be rewritten. Thus, there is a packet that may have to be rewritten at an interval of 2450 packets.

2450 packets are equivalent to:

24 samples×2450 packets=58800 samples

Since one sample is composed of four bytes, the following relation is satisfied.

58800 samples×4 bytes=235200 bytes

In a CD (Compact Disc), 98 frames are processes as one sector (sub code block). The capacity of one sector of a CD is 2352 bytes. Thus, a payload packet (packet with ID=0) is equivalent to 100 sectors of data of a content.

Thus, when there is a packet that may have to be rewritten at an interval of 2450 packets, a process for one packet (48 bits) every 100 sectors is required. This is a process for one bit every around two sectors. This process can be sufficiently performed by firmware.

Thus, according to the embodiment of the present invention, payload packets (packets with ID=0) are placed at intervals of which the payload packets can be sufficiently processed by firmware. Packets between payload packets are payload packet representation packets (ID=1). Thus, a process for rewriting a payload can be sufficiently performed by firmware. Since packets between payload packets (packets with ID=0) are payload packet position representation packets (packets with ID=1), payload packets are quickly accessed and processed.

In the example, at an interval of 2450 bytes, a payload packet (packet with ID=0) is placed. However, the interval is not limited to that. In other words, the interval of payload packets (packets with ID=0) is designated in consideration of time of watermark rewriting process.

In the example shown in FIG. 1, data of a watermark is embedded to each sample of data of a content. However, it is not necessary to embed data of a watermark to each sample of data of a content.

For example, as shown in FIG. 4, after data of a watermark is embedded to one packet of 24 samples of data of a content, the data of the watermark may not be embedded to several packets of the data of the content. In the example shown in FIG. 3, after data of a watermark is embedded to one packet of 24 samples of data of a content, the data of the watermark is not embedded to nine packets of the data of the content. In this case, data of a watermark is embedded to data of a content at an interval of (24×10=240) samples. Since one sample is composed of four bytes, the following relation is satisfied.

24 samples×10 packets×4 bytes=960 bytes

As with the above-described example, assuming that a payload packet (packet with ID=0) is placed at an interval of 100 sectors of data of a content, a payload packet (packet with ID=0) is placed at an interval of 245 packets. Thus, packet numbers PCK (PCK=0 to 244) are assigned.

After data of a watermark is embedded to one packet of 24 samples of data of a content, the data of the watermark is not embedded to several packets of the data of the content. In this case, since the number of samples of the data of that content in which the data of the watermark is not embedded increases, the audio quality improves. In other words, data of a watermark is embedded to a low order bit of data of a content. In particular, data of a watermark contains a fixed pattern. The fixed pattern tends to appear as noise. Thus, when the number of samples of data of a content in which data of a watermark is not embedded increases, the occurrence of such noise can be alleviated.

Of course, as the number of samples of data of a content in which data of a watermark is not embedded increases, the number of payload packet position representation packets (packets with ID=1) decreases. Thus, the access time for a payload packet (packet with ID=0) becomes long. However, at worst, a packet position representation packet (packet with ID=1) is detected between packet position representation packets (packets with ID=1) (in 100 sectors in this example). Thus, a payload packet (packet with ID=0) can be accessed. As a result, the process time does not substantially become slow.

The interval of packets to which data of a watermark is not embedded is decided in consideration of the process time and the audio quality (in the case that data of a content is audio data).

As was described above, after data of a watermark is embedded to one packet of 24 samples of data of a content, if the data of the watermark is not embedded to several packets of the data of the content, there are samples of which the data of the watermark is not embedded. Using this portion, data of a watermark of another type may be embedded. As information contained in embedded data of a watermark using such a portion, charging information, encryption key information, and so forth may be considered.

In the above-described example, the interval for which data of a watermark is not embedded is equivalent to a predetermined number of packets. However, the interval is not always fixed. In other words, the interval for which data of a watermark is not embedded may be changed in a predetermined pattern such as N packets, (N+2) packets, (N−2) packets, (N+4) packets, and (N−4) packets.

The interval for which data of a watermark is not embedded may be designated as a random number that is randomly generated.

When the interval for which data of a watermark is not embedded is constant, the component may appear as noise. However, as was described above, when the interval for which data of a watermark is not embedded is varied, the occurrence of noise can be prevented.

In the above-described example, the interval for which data of a watermark is not embedded is designated one packet of 24 samples of data of a content.

However, the interval for which data of a watermark is not embedded is not designated one sample of 24 samples of data of a content. For example, when data of a watermark is inserted into a low order bit of data of a content, since data of a watermark is inserted in the unit of one sample, the interval can be designated in the unit of one sample.

For example, data of a content may be processed in the unit of one sector (2352 bytes).

Figure 5:
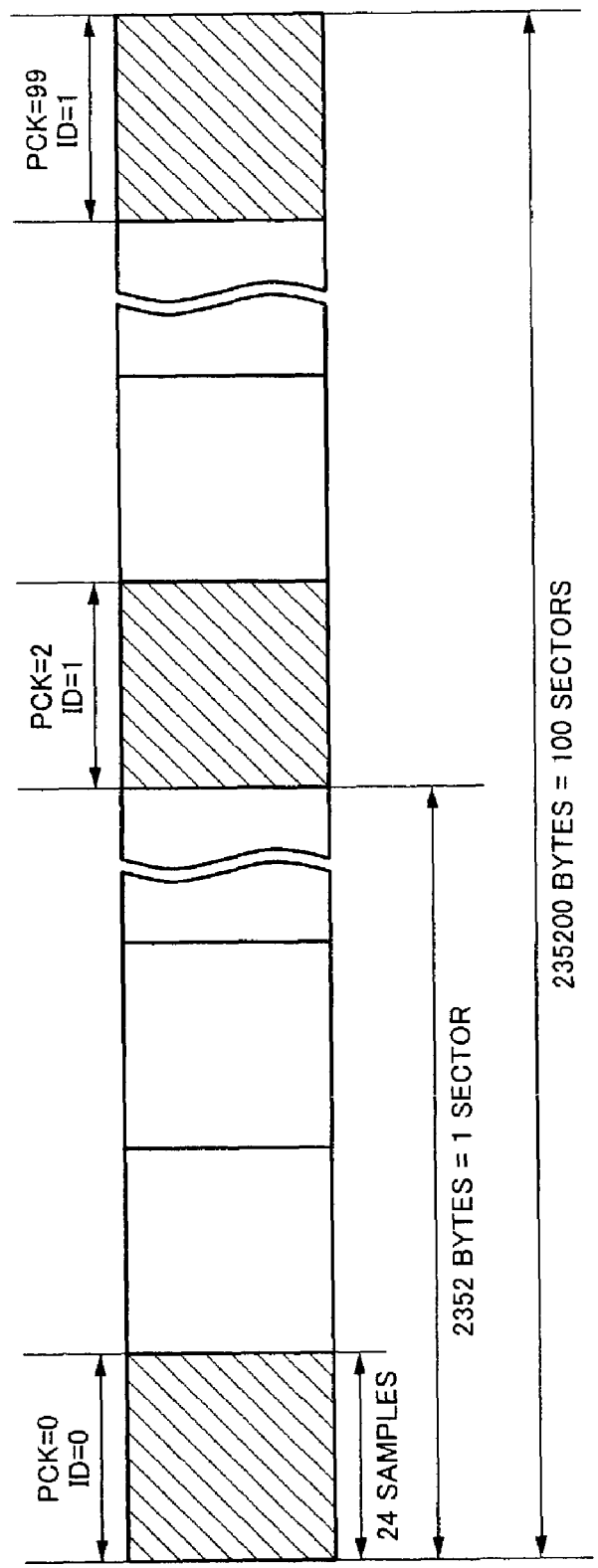
FIG. 5 is a schematic diagram for explaining an arrangement of a watermark.

In other words, FIG. 5 shows an example of which the interval for one packet matches one sector. In this case, the interval for one packet is equivalent to:

2352 bytes=(2352/96)=24.5 packets

Assuming that when a payload packet (packet with ID=0) is placed at intervals of 100 sectors of data of a content, packet numbers PCK (PCK=0 to 99) are assigned.

Thus; one packet of 48 bits of data of a watermark is inserted to each sector. In this case, the interval of one packet of 48 bits of data of a watermark becomes 24.5 packets. However, it is not always necessary to equally insert data of a watermark. For example, one packet of 48 bits of data of a watermark is inserted at a position apart by one sector.

Next, one packet of 48 bits of the data of the watermark is inserted at a position apart by (one sector+two packets). Next, one packet of 48 bits of the data of the watermark is inserted at a position apart by (one sector–two packets). In such a manner, the length of the interval for which data of a watermark is not embedded may be varied in a predetermined pattern. Alternatively, the length of the interval for which data of a watermark is not embedded may be varied at random.

As shown in FIG. 2B, to manage copy generations using the SCMS data, a watermark may have to be rewritten. The watermark is rewritten using a payload packet (packet with ID=0).

In other words, as shown in FIG. 2B, a payload packet (packet with ID=0) contains the SCMS data. If the SCMS data is "00", when data of a content is copied, the SCMS data is rewritten from "00" to "01" so that the data of the content can be copied in only one generation.

As shown in FIG. 2A, error detection CRC code is added to one packet. Thus, when a payload of a payload packet (packet with ID=0) is rewritten, it is necessary to re-obtain and rewrite the CRC code. However, the process for re-obtaining and rewriting the CRC code requires a large load. Thus, it is difficult for firmware to do that.

According to the embodiment of the present invention, when SCMS data is rewritten, CRC code is not changed, but kept unchanged. When a record medium is reproduced, all syndromes that may take place in a payload that is rewritten have been stored. When one of the syndromes that have been stored takes place, it is determined that no error takes place. Thus, it is not necessary to re-obtain and rewrite the CRC code. As a result, the required process is alleviated.

Figure 6A:
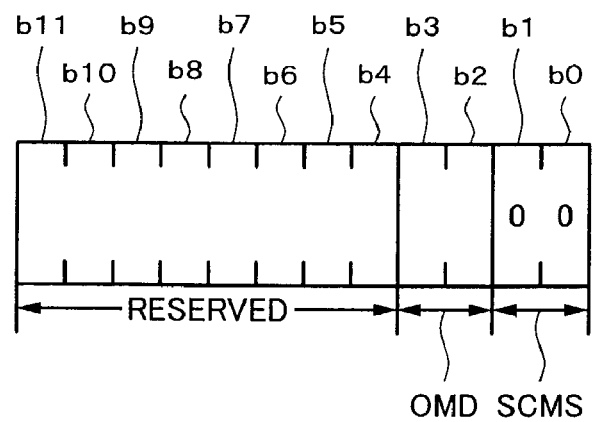
FIGS. 6A and 6B are schematic diagrams for explaining the rewriting of SCMS.

In other words, data of a payload packet is composed of 12 bits. In these bits, bit $b_0$ of SCMS shown in FIGS. 6A and 6B may have to be rewritten as information of the payload. In other words, when an original record medium is copied, the SCMS data shown in FIG. 6A is rewritten from "00" shown in FIG. 6A to "01" shown in FIG. 6B. Thus, bit $b_0$ is changed from "0" to "1". In other words, bit b0 represents whether the record medium on which data of a content that has been recorded is an original record medium or a copied record medium (non-original record medium).

As was described above, as a generation polynomial for CRC, the following expression is used.

$$G(x)=x^{16}+x^{15}+x^2+1$$

When a record medium is reproduced, a CRC calculation is performed so as to detect an error. At that point, when no error takes place, the syndrome becomes "0".

Figure 6B:
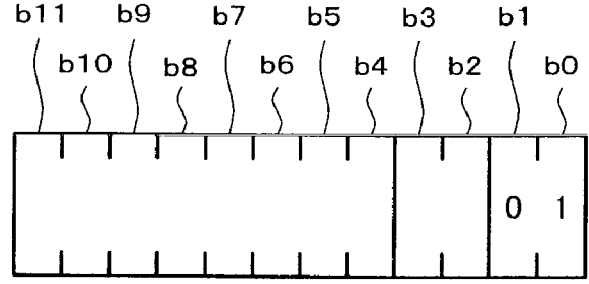

However, as shown in FIGS. 6A and 6B, the SCMS data may be rewritten from "00" to "01". As was described above, when the SCSM data is rewritten, if CRC code is not changed, but kept unchanged, even if no error takes place, the syndrome obtained in the CRC calculation becomes other than "0".

However, only bit $b_0$ of the SCMS data may be rewritten. In addition, the values of the syndrome that may take place corresponding to bit $b_0$ that is rewritten are known.

In other words, when it is assumed that the CRC calculation is performed with the above-described generation polynomial and that the original CRC code is kept unchanged, if bit $b_0$ is rewritten from "0" to "1", the syndrome becomes as follows:

$$x^{15}+x^2+1=8005h$$

Thus, assuming that when the SCMS data is rewritten, the CRC code is kept unchanged, when the record medium is reproduced, if no error takes place in the CRC calculation, the syndrome becomes "0" or "8005h". Only when bit $b_0$ of the SCMS data is rewritten from "0" to "1", the syndrome becomes "8005h".

Thus, assuming that if the syndrome is "0" or a predetermined value (namely, "8005h") in the CRC calculation performed when the record medium is reproduced, it is determined that no error takes place, when the SCMS data is rewritten, it is not necessary to change the CRC code. When it is not necessary to change the CRC code, the required process for rewriting the watermark is alleviated.

In addition, the syndrome becomes "8005h" as the predetermined value only when an original record medium is copied and thereby bit b0 of the SCMS data is rewritten from "0" to "1". Thus, when the syndrome is "8005h" as the predetermined value, by determining whether bit $b_0$ is "0" or "1", the error detection accuracy can be improved and an illegal copy operation can be prevented.

In other words, when the syndrome is "8005h" as the predetermined value, it is determined whether bit $b_0$ is "0" or "1".

When the syndrome is "8005h" as the predetermined value and bit $b_0$ is "1", since an original record medium is copied and bit $b_0$ of the SCMS data is rewritten from "0" to "1", it can be determined that no error takes place.

On the other hand, when the syndrome is "8005h" as the predetermined value, it is impossible that bit $b_0$ becomes "0". Thus, in this case, it is determined that the SCMS data has an error.

In other words, bit $b_0$ becomes "0" when the SCMS data is "00" and the record medium is an original disc. When the record medium is an original disc, since the SCMS data has not been rewritten, the syndrome must be "0".

Thus, when the syndrome is "8005h" as the predetermined value and bit $b_0$ is "0", it is assumed that an error takes place or the SCMS data is illegally rewritten.

Thus, when the syndrome is "8005h" as the predetermined value, it is determined whether bit $b_0$ is "0" or "1". When bit $b_0$ is "1", it is determined that no error takes place. When bit $b_0$ is "0", it is determined that an error takes place.

Assuming that two bits of bits $b_0$ and $b_1$ of the SCMS data have been rewritten, when the record medium is reproduced, the syndrome becomes as follows.

$$x^3+x=000Ah$$

Thus, assuming that there is a probability of which bit $b_0$ or bits $b_0$ and $b_1$, are rewritten, when the syndrome is "0", "8005h", or "000Ah", it can be determined that no error takes place.

Next, a recording medium that embeds a watermark to data of a content in the above-described manner and records the resultant data to a record medium will be described.

FIG. 7 is an example of such a recording apparatus. In the example, as a record medium, a recordable optical disc for example a CD-R or a CD-RW is used.

In FIG. 7, data of a content is supplied to an input terminal 1. The data of the content is for example digital audio data on left and right channels, the digital audio data on each channel being digitized with 16 bits. The data of the content is supplied from the input terminal 1 to a watermark adding circuit 2.

Data of a watermark is supplied to an input terminal 3. The data of the watermark is supplied to a watermark generating circuit 4. An output of the watermark generating circuit 4 is supplied to the watermark adding circuit 2.

The watermark adding circuit 2 embeds the data of the watermark supplied from the watermark generating circuit 4 to the data of the content supplied from the input terminal 1. As was described above, the watermark is processed in the unit of one packet of 48 bits. Payload packets (packets with ID=0) are placed at intervals of for example 2450 packets. Packets between payload packets are payload packet position representation packets (packets with ID=1). The watermark adding circuit 2 generates such two types of packets.

Since copy generations are managed with the SCMS data, the watermark may have to be rewritten. The watermark is rewritten using payload packets (packets with ID=0).

In other words, a payload packet (packet with ID=0) contains SCMS data. If the SCMS data is "00", when data of a content is copied, the SCMS data is rewritten from "00" to "01" so that the copy operation can be performed in only one generation.

Error detection CRC code is added to one packet. Thus, when the payload of a payload packet (packet with ID=0) is rewritten, it is necessary to re-obtain and rewrite the CRC code. However, the process for re-obtaining and rewriting the CRC code imposes a large load to firmware. Thus, firmware cannot perform such a process.

As was described above, when the SCMS data is rewritten, the CRC code is not re-obtained, but kept unchanged. When the record medium is reproduced, all syndromes that take place in the payload that is rewritten have been stored. When a syndrome that takes place in the payload that is rewritten matches any stored syndrome, it is determined that the SCMS data does not have an error.

As an example, data of a watermark is embedded to a low order bit of data of a content.

As other methods for watermarks, additional information may be inserted into a high order coefficient of compressed data of a content. A spectrum of additional information may be spread to data of a content so as to superimpose the spectrum of the additional information to the data of the content. Data of a watermark may be inserted into a first peak or a second peak in a predetermined range, or the vicinity thereof. Of course, another watermark can be used.

However, to manage copy generations using the SCMS data, it is necessary to rewrite a watermark. In consideration of rewriting the watermark, the method for inserting a watermark at a low order bit of data of a content or the method for inserting additional information to a high order coefficient of compressed data of a content may be used. In the method for spreading additional information using spectrum spreading and superimposing the spread additional information on data of a content or the method for inserting a watermark in a first peak or a second peak in a predetermined range of data of a content or the vicinity thereof, since a watermark should be added corresponding to data of the content, it is difficult to rewrite the watermark. When data of a content is audio data, using masking effect, the watermark may be prevented from affecting the reproduced data of the content.

An output of the watermark adding circuit 2 is supplied to an error correction code encoding circuit 5. The error correction code encoding circuit 5 performs an error correcting process.

An output of the error correction code encoding circuit 5 is supplied to a modulating circuit 6. The modulating process necessary for recording data to an optical disc as a record medium is performed by the modulating circuit 6. An output of the modulating circuit 6 is supplied to an optical pickup through a recording amplifier 7. The optical pickup 8 records data of a content in which data of a watermark has been embedded to an optical disc 9.

The optical disc on which data of a content has been recorded is sold or distributed as a reproduction-only disc such as a CD or a CD-ROM. In this case, with a master disc using an optical disc produced in the above-described manner, optical discs to be sold and distributed are produced.

Figure 8:
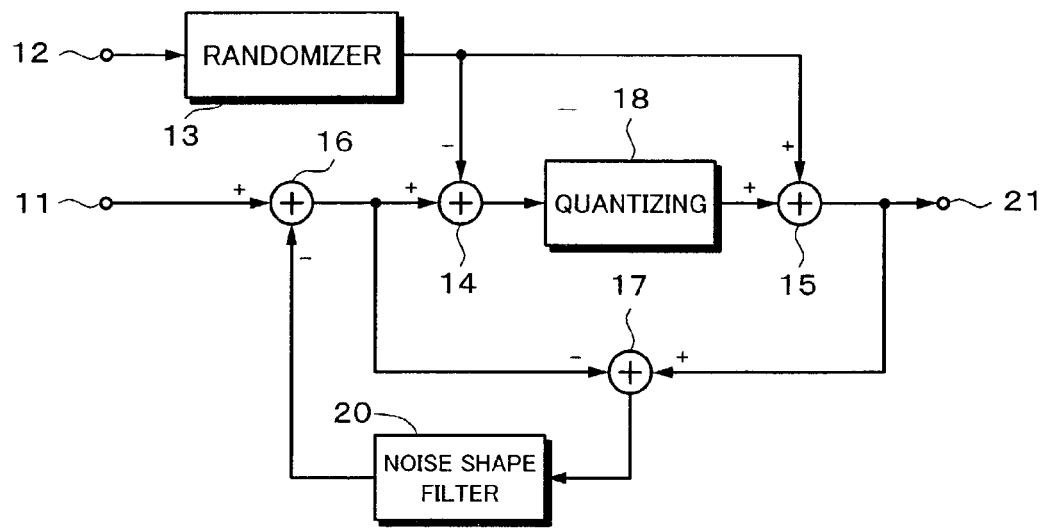
FIG. 8 is a block diagram showing an example of a watermark encoder.

FIG. 8 shows an example of an encoder that inserts a watermark into data of a content. In the example shown in FIG. 8, information of a watermark is inserted into a low order bit of the data of the content. In the example, the information of the watermark is inserted into a frequency band of the data of the content so that when the data of the content is reproduced, the component of the information of the watermark does not affect the acoustic sense. Such an encoder can be used as the watermark adding circuit 2 shown in FIG. 2.

In FIG. 8, original data such as audio data and video data is supplied to an input terminal 11. Data of a watermark is supplied to an input terminal 12.

The data of the watermark supplied from the input terminal 12 is supplied to a randomizer 13. The randomizer 13 causes the data of the watermark to become white noise. An output of the randomizer 13 is supplied to both a subtracting circuit 14 and an adding circuit 15.

The data of the content that is input from the input terminal 11 is supplied to a subtracting circuit 16. An output of the subtracting circuit 16 is supplied to both the subtracting circuit 14 and a subtracting circuit 17. An output of the subtracting circuit 14 is supplied to a quantizing circuit 18. An output of the quantizing circuit 18 is supplied to the adding circuit 15.

The adding circuit 15 adds an output of the quantizing circuit 18 and an output of the randomizer 13. An output of the adding circuit 15 is output from an output terminal 21. In addition, the output of the adding circuit 15 is supplied to the subtracting circuit 17. The subtracting circuit 17 subtracts the output of the subtracting circuit 16 from the output of the adding circuit 15.

An output of the subtracting circuit 17 is supplied to a noise shape filter 20. An output of the noise shape filter 20 is supplied to the subtracting circuit 16. The subtracting circuit 16 subtracts the output of the noise shape filter 20 from the data that is input from the input terminal 11.

The watermark encoder shown in FIG. 8 inserts data of a watermark into a low order bit of data. The band where the watermark does not affect the acoustic sense.

In other words, in FIG. 8, data that is input from the input terminal 11 is quantized by the quantizing circuit 18. The adding circuit 15 inserts data of a watermark that is output from the randomizer 13 into a low order bit of data that is output from the quantizing circuit 18.

The quantizing circuit 18 is preceded by the subtracting circuit 14. The subtracting circuit 14 subtracts the data of the watermark from the data that is input from the input terminal 11. Thus, on the upstream stage of the quantizing circuit 18, the data of the watermark is subtracted from the data that is input from the input terminal 11. Thus, the adding circuit 15 followed by the quantizing circuit 18 eliminates the influence of the data of the watermark inserted into the data of the content.

The adding circuit 15 outputs data to which the data of the watermark has been added. An output of the adding circuit 15 is output from the output terminal 21. In addition, the subtracting circuit 17 subtracts the output data of the quantizing circuit 18 from the input data of the quantizing circuit 18. Thus, the noise component that takes place in the quantizing process is removed. The noise component is moved by the noise shape filter 20 to a place where the noise component does not affect the data of the content and supplied to the subtracting circuit 16.

Figure 9:
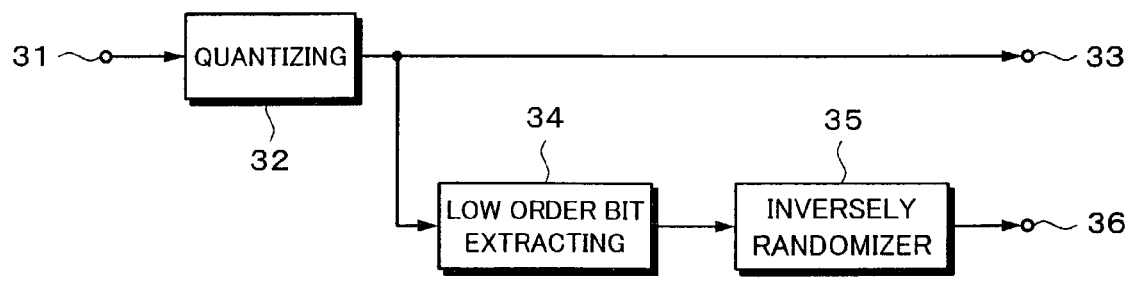
FIG. 9 is a block diagram showing an example of a watermark decoder.

FIG. 9 shows an example of a watermark decoder that decodes information of a watermark that has been inserted in the above-described manner.

In FIG. 9, data that is output from the output terminal of the encoder shown in FIG. 8 is supplied to an input terminal 31. The data that is output from the output terminal of the encoder is the data of the content to which the watermark has been superimposed. The data that is input from the input terminal 31 is supplied to a quantizing circuit 32. An output of the quantizing circuit 32 is output from an output terminal 33. In addition, the output of the quantizing circuit 32 is supplied to a low order bit extracting circuit 34.

The low order bit extracting circuit 34 extracts the data of the watermark inserted into the low order bit of the output data of the quantizing circuit 32. The data of the watermark extracted by the circuit 34 is supplied to an inverse randomizer 35.

The inverse randomizer 35 performs an inverse process of the randomizer 13 of the above-described encoder. The inverse randomizer 35 restores the information of the randomized watermark into the original information. From the inverse randomizer 35, the information of the watermark is obtained. The information of the watermark is output from an output terminal 36.

Figure 10:
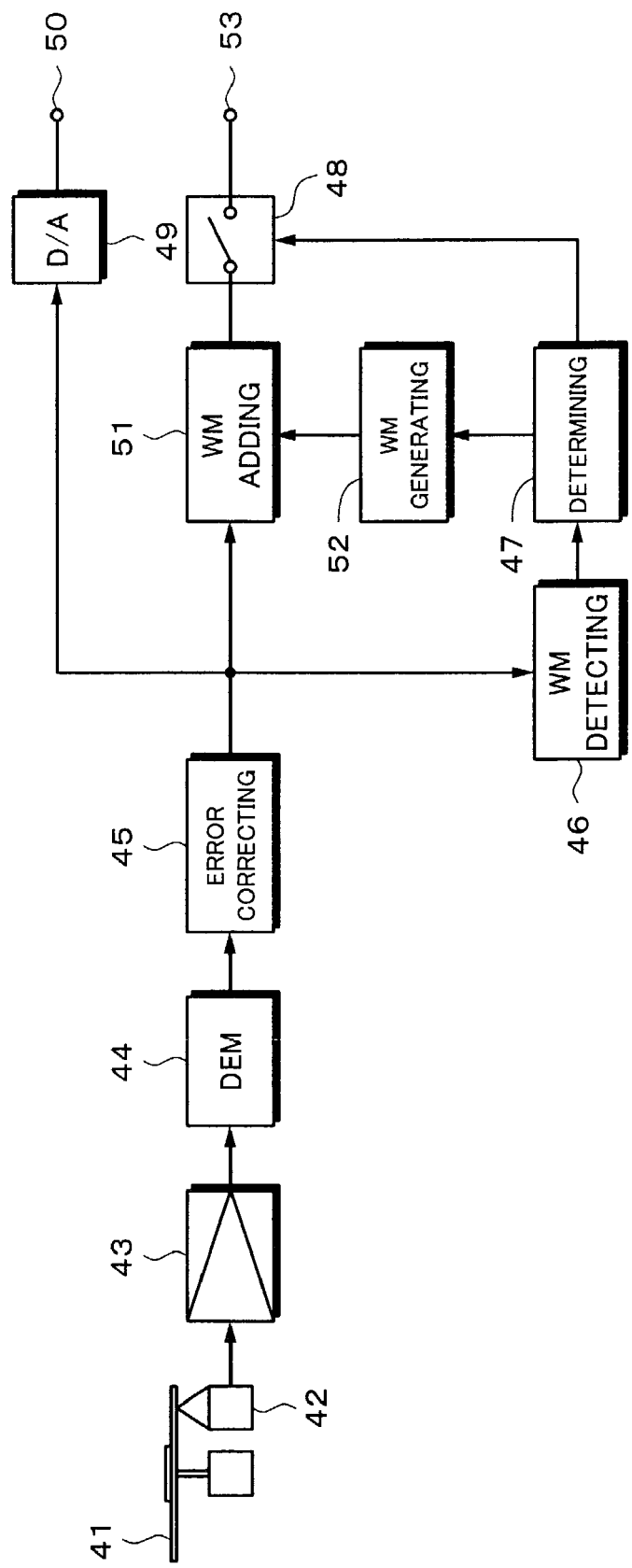
FIG. 10 is a block diagram showing an example of a reproducing apparatus according to the present invention.

FIG. 10 shows an example of a reproducing apparatus. In FIG. 10, data recorded on an optical disc 41 is read by an optical pickup 42. An output signal of the optical pickup 42 is supplied to a demodulating circuit 44 through a reproducing amplifier 43. The demodulating circuit 44 performs a demodulating process that is an inverse process of the modulating process performed by the modulating circuit 6. Output data of the demodulating circuit 44 is supplied to an error correcting circuit 45. The error correcting circuit 45 performs an error correcting process for the output data of the demodulating circuit 44.

An output signal of the error correcting circuit 45 is supplied to a D/A converter 49. The D/A converter 49 converts a digital signal as the output signal of the error correcting circuit 45 into an analog signal. An output signal of the D/A converter 49 is output from an output terminal 50.

An output signal of the error correcting circuit 45 is supplied to both a watermark detecting circuit 46 and a watermark adding circuit 51. The watermark detecting circuit 46 detects data of a watermark from the output signal of the error correcting circuit 45.

An output of the watermark detecting circuit 46 is supplied to a determining circuit 47. Corresponding to an output of the determining circuit 47, a switch circuit 48 is controlled so as to control the copy operation of data that is read from the optical disc 41 as a record medium.

An output signal of the error correcting circuit 45 is supplied to the watermark adding circuit 51. A watermark generating circuit 52 generates a watermark corresponding to an output of the determining circuit 47. The newly generated watermark is supplied from the watermark generating circuit 52 to the watermark adding circuit 51. When the watermark should be rewritten, the watermark adding circuit 51 performs a rewriting process for the watermark embedded in the output signal of the error correcting circuit 45.

An output signal of the watermark adding circuit 51 is supplied to a data output terminal 53 through a switch circuit 48.

Data of a watermark has been embedded to data of a content recorded on the optical disc 41. The data of the watermark is detected by the watermark detecting circuit 46. As the watermark detecting circuit 46, the structure shown in FIG. 9 can be used.

As described above, a watermark is processed in the unit of one packet of 48 bits. Payload packets (packets with ID=0) are placed at intervals of for example 4350 packets. Packets between two payload packets are payload packet position representation packets (packets with ID=1).

The determining circuit 47 reads data of one packet of 48 bits, detects an identifier ID from the data of the watermark, and determines the type of the packet. When the detected identifier ID is (ID=0), since the packet is a payload packet, the copy operation such as a copy limiting process for the data of the content that is read from the optical disc 41 is performed corresponding to the description of the payload of the packet. When the detected identifier ID is (ID=1), the offset information (Offset_Info) is read. A payload packet apart by the distance of the offset information (Offset_Info) is read. Corresponding to the description of the payload of the packet, the copy operation for the data of the content that is read from the optical disc 41 is performed.

Figure 11:
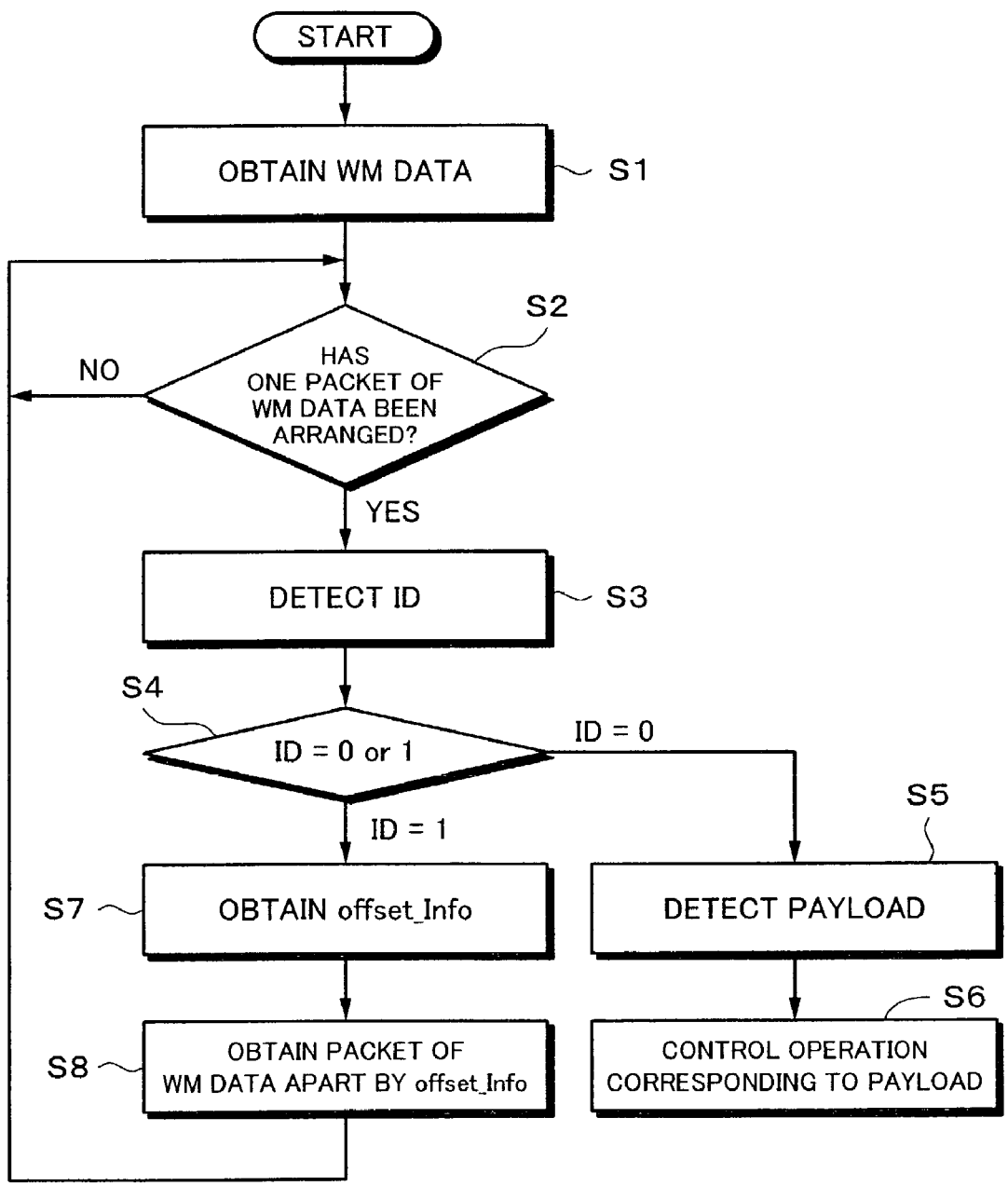
FIG. 11 is a flow chart for explaining a reproducing process for a watermark.

FIG. 11 is a flow chart showing a process of the determining circuit 47. In FIG. 11, after data of a watermark is obtained (at step S1), it is determined whether or not one packet (48 bits) thereof has been arranged (at step S2). When one packet of the data of the watermark has been arranged, an identifier ID is detected (at step S3). It is determined whether or not the identifier ID is (ID=0) or (ID=1) (at step S4). When the identifier ID is (ID=0), since the packet is a payload packet, the payload is detected (at step S5). Corresponding to the payload, an operation such as a copy management for the data of the content that is read from the optical disc 41 is controlled (at step S6).

When the identifier ID is (ID=1) at step S4, since the packet is a payload packet position representation packet, the offset information (Offset_Info) is read (at step S7). A packet of the data of the watermark apart by the offset information (Offset_Info) is obtained (at step S8).

Thereafter, the flow returns to step S2. It is determined whether or not one packet (48 bits) of the data of the watermark has been arranged. When one packet of the data of the watermark has been arranged, the flow advances to step S3. At step S3, an identifier ID is detected.

When the packet of the data of the watermark apart by the offset information (Offset_Info) obtained at step S7 is obtained, the packet is a payload packet. Thus, the identifier ID must be (ID=0).

At step S4, it is determined whether the identifier ID is (ID=0) or (ID=1). When the identifier ID is (ID=0), the flow advances to step S5. At step S5, the payload is detected. At step S6, corresponding to the payload, an operation such as a copy management for the data of the content that is read from the optical disc 41 is controlled.

When the identifier ID is (ID=1) at step S4, the flow advances to step S7. At step S7, offset information (Offset_Info) is read. At step S8, a packet of the data of the watermark apart by the offset information (Offset_Info) is obtained. Thereafter, the flow returns to step S2.

Figure 12:
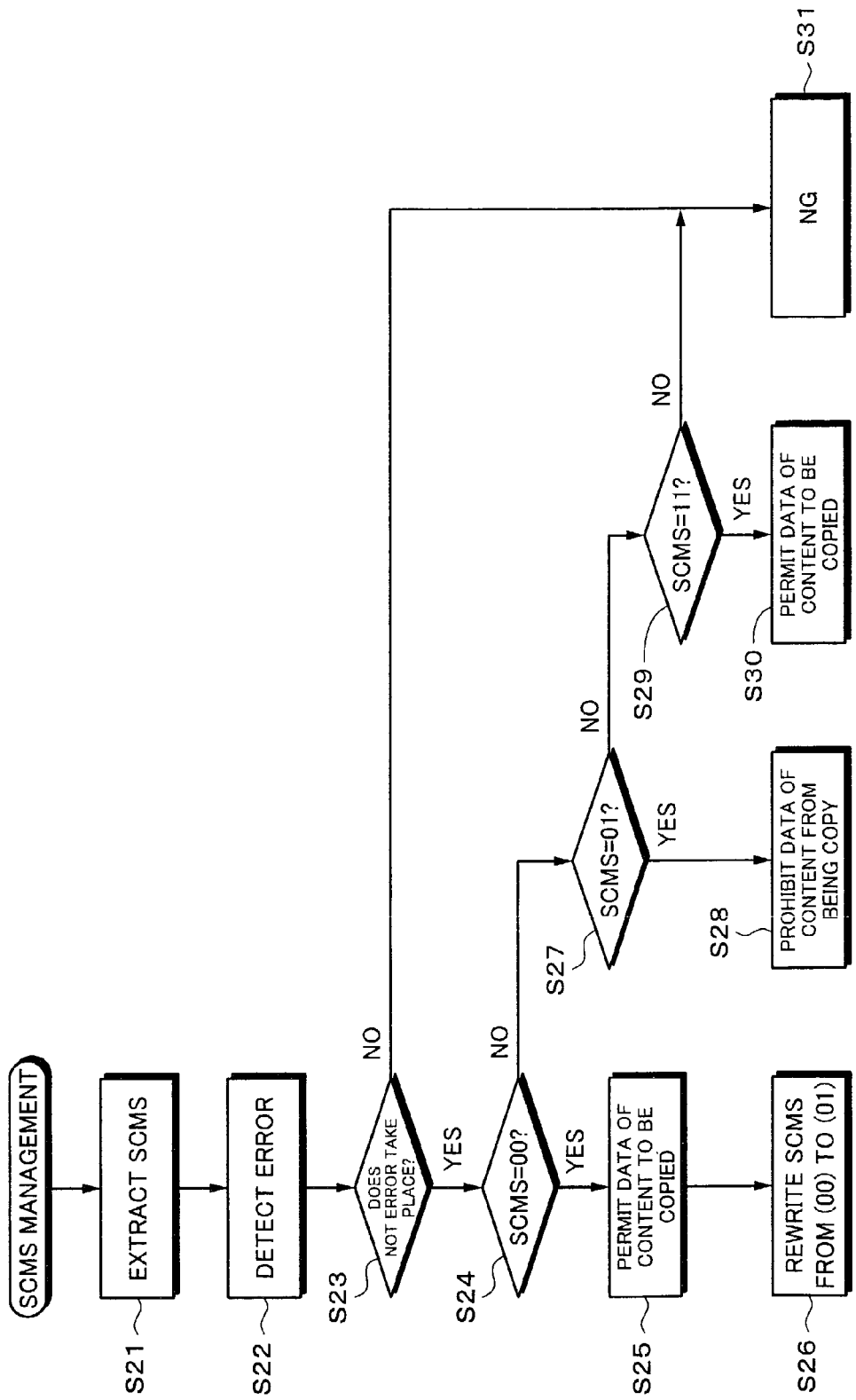
FIG. 12 is a flow chart for explaining an example of a management using SCMS.

FIG. 12 is a flow chart showing a copy management using SCMS in the operation control corresponding to a payload (at step S6, FIG. 11).

The SCMS data is copy generation management information. When the SCMS data is "00", it represents that the record medium is an original record medium. In this case, data of a content that is read from the optical disc 41 is permitted to be copied in only one generation. When the data of the content is copied, as was described above, the SCMS data is rewritten from "00" to "01". When the SCMS data is "01", it represents that the record medium is a copied record medium. In this state, the data of the content that is read from the optical disc 41 is prohibited from being further copied. When the SCMS data is "11", the data of the content that is read from the optical disc 41 can be freely copied.

In FIG. 12, SCMS data is extracted from the payload portion of a payload packet (ID=0) (at step S21).

As was described above, using CRC code, an error detecting process is performed (at step S22). Corresponding to the result of the error detecting process, it is determined whether or not an error takes place (at step S23). When the determined result represents that an error takes place, an NG process is performed (at step S31). For example, at step S31, as the NG process, a side error detecting process is performed. In this case, a displaying portion (not shown) disposed in the reproducing apparatus displays an alarm that prompts the user to cancel or stop the reproducing operation.

When the determined result represents that no error takes place, it is determined whether or not the SCMS data is (SCMS=00) (at step S24). When the SCMS data is (SCMS=00), since the record medium is an original record medium, the switch circuit 48 shown in FIG. 10 is turned on so that the data of the content that is read from the optical disc 41 is permitted to be copied (at step S25). Data of a watermark newly generated by the watermark generating circuit 52 causes a packet (ID=0) to be rewritten so that the SCMS data is changed from "00" to "01". Thus, the data of the copied content is prohibited from being further copied. In other words, the data of the content that is read from the optical disc 41 is permitted to be copied in only one generation.

When the determined result at step S24 represents that the SCMS data is not (SCMS=00), it is determined whether or not the SCMS data is (SCMS=01) (at step S27). When the SCMS data is (SCMS=01), since the record medium is a copied record medium, the switch circuit 48 is turned off so that the data of the content that is read from the optical disc 41 is prohibited from being copied (at step S28).

When the determined result at step S27 represents that the SCMS data is not (SCMS=01), it is determined whether or not the SCMS data is (SCMS=11) (at step S29). When the SCMS data is (SCMS=11), since the data of the content that is read from the optical disc 41 can be freely copied, the switch circuit 48 is turned on so that the data of the content that is read from the optical disc 41 can be copied (at step S30).

When the determined result at step S29 represents that the SCMS data is not (SCMS=11), since this state does not take place, an NG process is performed (at step S30). In this case, as the NG process, a process for prohibiting the data of the content that is read from being copied or a process for ignoring the SCMS data may be performed.

FIG. 13 is a flow chart showing an error detecting process (at step S22, FIG. 12). As was described above, in the example, when the SCMS data is rewritten, the CRC code is kept unchanged. In this case, when no error is detected, the syndrome becomes "0" or "8005h". The syndrome becomes "8005h" when bit $b_0$ of the SCMS data is rewritten from "0" to "1". In such a manner, predicted syndromes are pre-calculated and pre-stored.

In FIG. 13, a CRC calculation is performed so as to obtain a syndrome (at step S51). In the CRC calculation, the following generation polynomial is used.

$$G(X)=x^{16}+x^{15}+x^2+1$$

It is determined whether or not the syndrome is "0" (at step S52). When the syndrome is "0", it is determined that no error takes place (at step S53).

When the determined result at step S52 represents that the syndrome is not "0", it is determined whether or not the syndrome is "8005h" (at step S54). When the syndrome is not "8005h", it is determined that an error takes place (at step S56).

When the syndrome is "8005h", it is determined whether or not bit $b_0$ is "1" (at step S55). When bit $b_0$ is "1", it is determined that no error takes place (at step S53). When bit $b_0$ is "0", it is determined that an error takes place (at step S56).

When the SCMS data is rewritten, the CRC code is kept unchanged. When the record medium is reproduced, the CRC calculation is performed. In this case, when the syndrome is "0" or "8005h", it is determined that no error takes place. Thus, even when the SCMS data is rewritten, it is not necessary to change the CRC code. As a result, when a watermark is rewritten, the required process is alleviated.

In the example, when the syndrome is "8005h", it is determined whether or not bit $b_0$ of the SCMS data is "1". Alternatively, it may be determined whether or not the syndrome is "0" or "8005h" so as to detect an error.

In the above-described example, as error detection code, CRC code is used. However, the present invention can be applied to the case that another error detection code or another error correction code is used.

Moreover, in the above-described example, data of a content to which a watermark has been embedded is recorded to a record medium. However, the present invention can be applied to the case that data of a content is transmitted.

In other words, nowadays, music information and picture information are transmitted through a network. When data of such contents is transmitted, a watermark may be embedded thereto. In such a case, when data of a content is transmitted, if a part of information of a watermark embedded to the data of the content that is transmitted is rewritten, error detection code and error correction code are kept unchanged. The reception side pre-stores syndromes that will take place when a part of information of a watermark is rewritten. Using the syndromes that will take place when a part of information of a watermark is rewritten, an error can be detected and corrected.

According to the present invention, a watermark is embedded to data of a content. When a part of the watermark is rewritten, CRC code for detecting an error is kept unchanged. When a watermark contains SCMS information and it is predicted that bit $b_0$ of the SCMS information will be rewritten, a syndrome value "8005h" that will correspondingly take place is pre-obtained and pre-stored.

When the record medium is reproduced and the CRC calculation is performed, it is determined whether the calculated result is a syndrome value that represents that no error takes place or a syndrome value that may take place when information of a watermark is rewritten. When the calculated result is a syndrome value that represents that no error takes place or a syndrome value that may take place when the watermark is rewritten, it is determined that no error takes place.

For example, predicting that bit $b_0$ of SCMS information will be rewritten and that when bit $b_0$ is rewritten, the syndrome value becomes "8005h", if the syndrome value is "0" or "8005h", it is determined that no error takes place.

Thus, even if a part of a watermark is rewritten, it is not necessary to change error detection code and error correction code. As a result, the required process necessary for rewriting a watermark can be alleviated.

Industrial Applicability

As was described above, the present invention is suitably used for a reproducing apparatus that reproduces data of a content to which copy management information and additional information (containing error detection code and error correction code added to the management information) have been embedded.

What is claimed is:

1. A reproducing apparatus for a record medium, the reproducing apparatus comprising:
   a head portion for scanning a record medium on which content data are recorded, wherein management information and additional information are embedded in the content data; the management information correspond to copy management; and the additional information contains one of error detection code and error correction code added to the management information;
   a demodulation processing portion for performing a demodulating process on data read from the record medium by the head portion;
   a detecting circuit portion for detecting the additional information from an output signal of the demodulation processing portion; and
   a determining circuit portion for performing an error detecting process on a detected result from the detecting circuit portion corresponding to the error detection code contained in the additional information detected by the detecting circuit portion and controlling an output operation for the output signal of the demodulation processing portion for the content data read from the record medium corresponding to the management information when no error occurs in the error detecting process.

2. The reproducing apparatus for the record medium as set forth in claim 1,
   wherein the determining circuit portion rewrites the management information and adds one of the error detection code and the error correction code to the rewritten management information without modification when the determining circuit portion outputs the output signal of the demodulation processing portion.

3. The reproducing apparatus for the record medium as set forth in claim 2, further comprising:
   a rewriting portion controlled by the determining circuit portion for rewriting the management information contained in the output signal of the demodulation processing portion.

4. The reproducing apparatus for the record medium as set forth in claim 3, the rewriting portion comprising:
   a generating portion for generating new management information corresponding to a control signal supplied from the determining circuit portion; and
   an adding circuit portion for adding the new management information generated by the generating portion to the output signal of the demodulation processing portion.

5. The reproducing apparatus for the record medium as set forth in claim 3,
   wherein the determining circuit portion permits the output signal of the demodulation processing portion to be output and causes the rewriting portion to rewrite the management information when the management information permits the content data read from the record medium to be copied.

6. The reproducing apparatus for the record medium as set forth in claim 5,
   wherein the determining circuit portion causes the rewriting portion to rewrite the management information so that the management information prohibits the content data read from the record medium from being copied.

7. The reproducing apparatus for the record medium as set forth in claim 3,
   wherein the determining circuit portion prohibits the output signal of the demodulation processing portion from being output when the management information prohibits the content data read from the record medium from being copied.

8. The reproducing apparatus for the record medium as set forth in claim 1,
   wherein when the determining circuit portion detects that an error occurs corresponding to one of the error detection code and the error correction code the determining circuit portion stops the operation.

9. The reproducing apparatus for the record medium as set forth in claim 1,
   wherein the determining circuit portion calculates a syndrome corresponding to the error detection code and determines whether an error occurs depending on whether the calculated syndrome is a predetermined value.

10. The reproducing apparatus for the record medium as set forth in claim 1,
    wherein the determining circuit portion calculates a syndrome corresponding to one of the error detection code and the error correction code and determines whether an error occurs depending on whether the calculated syndrome is a predetermined value and corresponds to the management information.

11. The reproducing apparatus for the record medium as set forth in claim 10,
    wherein the determining circuit portion determines that no error occurs when the calculated syndrome is zero and the management information permits the content data to be copied.

12. The reproducing apparatus for the record medium as set forth in claim 10,
    wherein the determining circuit portion determines that no error occurs when the calculated syndrome is a predetermined value and the management information prohibits the content data from being copied.

13. The reproducing apparatus for the record medium as set forth in claim 10,
    wherein the determining circuit portion determines that an error occurs when the calculated syndrome is a predetermined value and the management information permits the content data to be copied.

14. The reproducing apparatus for the record medium as set forth in claim 10,
    wherein the determining circuit portion determines that no error occurs when the calculated syndrome is zero and the management information represents that the record medium is an original record medium.

15. The reproducing apparatus for the record medium as set forth in claim 10,
    wherein the determining circuit portion determines that no error occurs when the calculated syndrome is a predetermined value and the management information represents that the record medium is a non-original record medium.

16. The reproducing apparatus for the record medium as set forth in claim 10,
    wherein the determining circuit portion determines that an error occurs when the calculated syndrome is a predetermined value and the management information represents that the record medium is an original record medium.

17. The reproducing method for the record medium as set forth in claim 16,
wherein when the calculated syndrome is a predetermined value and the management information represents that the record medium is an original record medium the result of the determining step represents that the error takes place.

18. A reproducing method for a record medium, the reproducing method comprising the steps of:
performing a demodulating process for data read from a record medium on which content data are recorded, wherein management information and additional information are embedded in the content data; the management information correspond to copy management; and the additional information contains one of an error detection code and an error correction code added to the management information;
detecting the additional information from an output signal of the demodulation process;
performing an error detecting process corresponding to one of the error detection code and the error correction code of the detected additional information; and
controlling an output operation for an output signal on which the demodulating process has been performed for the content data read from the record medium corresponding to the management information when no error occurs in the error detecting process.

19. The reproducing method for the record medium as set forth in claim 18,
wherein the controlling step is performed by rewriting the management information and adding at least one of the error detection code and the error correction code to the rewritten management information.

20. The reproducing method for the record medium as set forth in claim 19, further comprising the step of:
permitting the output signal to be output and rewriting the management information when the management information permits the content data read from the record medium to be copied.

21. The reproducing method for the record medium as set forth in claim 20, further comprising the step of:
prohibiting the output signal from being output when the management information prohibits the content data read from the record medium from being copied.

22. The reproducing method for the record medium as set forth in claim 19,
wherein the rewriting step is performed so that the management information prohibits the content data read from the record medium from being copied.

23. The reproducing method for the record medium as set forth in claim 18, further comprising the step of:
stopping the operation when it is detected that an error occurs corresponding to one of the error detection code and the error correction code.

24. The reproducing method for the record, medium as set forth in claim 18, further comprising the step of:
calculating a syndrome corresponding to one of the error detection code and the error correction code and determining whether an error occurs depending on whether the calculated syndrome is a predetermined value.

25. The reproducing method for the record medium as set forth in claim 18, further comprising the step of:
calculating a syndrome corresponding to one of the error detection code and the error correction code and determining whether an error occurs depending on whether the calculated syndrome is a predetermined value and corresponds to the management information.

26. The reproducing method for the record medium as set forth in claim 25,
wherein when the calculated syndrome is zero and the management information permits the content data to be copied the result of the determining step represents that no error occurs.

27. The reproducing method for the record medium as set forth in claim 25,
wherein when the calculated syndrome is a predetermined value and the management information prohibits the content data from being copied the result of the determining step represents that no error occurs.

28. The reproducing method for the record medium as set forth in claim 25,
wherein when the calculated syndrome is a predetermined value and the management information permits the content data to be copied the result of the determining, step represents that the error occurs.

29. The reproducing method for the record medium as set forth in claim 25,
wherein when the calculated syndrome is zero and the management information represents that the record medium is an original record medium the result of the determining step represents that no error occurs.

30. The reproducing method for the record medium as set forth in claim 25,
wherein when the calculated syndrome is a predetermined value and the management information represents that the record medium is a non-original record medium the result of the determining step represents that no error occurs.

31. A data output controlling method, comprising the steps of:
detecting additional information from content data, wherein management information and additional information are embedded in the content data; the management information corresponds to copy management; and the additional information contains one of error detection code and error correction code added to the management information;
performing an error detecting process corresponding to one of the error detection code and the error correction code of the detected additional information; and
controlling an output operation for the content data corresponding to the management information when no error occurs in the error detecting process.

32. The data output controlling method as set forth in claim 31,
wherein the controlling step is performed by rewriting the management information and adding one of the error detection code and the error correction code to the rewritten management information without modification when the content data is output.

33. The data output controlling method as set forth in claim 31, further comprising the step of:
stopping the operation when it is detected that the error occurs corresponding to one of the error detection code and the error correction code.

34. The data output controlling method as set forth in claim 31, further comprising the step of:
calculating a syndrome corresponding to one of the error detection code and the error correction code and determining whether the error occurs depending on whether the calculated syndrome is a predetermined value.

35. The data output controlling method as set forth in claim 31, further comprising the step of:
calculating a syndrome corresponding to one of the error detection code and the error correction code and determining whether the error occurs depending on whether the calculated syndrome is a predetermined value and corresponds to the management information.

36. The data output controlling method as set forth in claim 35,
wherein when the calculated syndrome is zero and the management information permits the content data to be copied a result of the determining step represents that no error occurs.

37. The data output controlling method as set forth in claim 35,
wherein when the calculated syndrome is a predetermined value and the management information prohibits the content data from being copied a result of the determining step represents that no error occurs.

38. The data output controlling method as set forth in claim 35,
wherein when the calculated syndrome is a predetermined value and the management information permits the content data to be copied a result of the determining step represents that the error occurs.

39. The data output controlling method as set forth in claim 35,
wherein when the calculated syndrome is zero and the management information represents an original record medium a result of the determining step represents that no error occurs.

40. The data output controlling method as set forth in claim 35,
wherein when the calculated syndrome is a predetermined value and the management information represents a non-original record medium a result of the determining step represents that no error occurs.

41. The data output controlling method as set forth in claim 35,
wherein when the calculated syndrome is a predetermined value and the management information represents an original record medium a result of the determining step represents that the error occurs.

42. A data outputting method, comprising the steps of:
rewriting management information when the management information and additional information are embedded in content data, wherein the management information corresponds to copy management and the additional information contains one of error detection code and error correction code; adding at least one of the error detection code and the error correction code to the rewritten management information; and outputting resultant data.

43. An error detecting method, comprising the steps of:
pre-obtaining a syndrome corresponding to at least one of an error detection code and an error correction code when a part of the data to which one of error detection code and error correction code is added has been rewritten;
obtaining a syndrome corresponding to one of the error detection code and the error correction code when the data is reproduced; and
detecting whether an error occurs corresponding to the obtained syndrome and the pre-obtained syndrome.

44. The error detecting method as set forth in claim 43,
wherein the detecting step is performed depending on one of whether the obtained syndrome is zero and whether the obtained syndrome matches the pre-obtained syndrome.

45. The error detecting method as set forth in claim 44,
wherein when one of the obtained syndrome is zero and the obtained syndrome matches the pre-obtained syndrome a result of the detecting step represents that no error occurs.

46. The error detecting method as set forth in claim 44,
wherein when one of the obtained syndrome is zero and the obtained syndrome does not match the pre-obtained syndrome a result of the detecting step represents that the error occurs.

47. The error detecting method as set forth in claim 43,
wherein the detecting step is performed corresponding to the data, the pre-obtained syndrome, and the obtained syndrome.

48. The error detecting method as set forth in claim 43,
wherein when a part of the data is rewritten the detecting step is performed corresponding to the rewritten part of the data, the pre-obtained syndrome, and the obtained syndrome.

49. A data outputting and reproducing method, comprising the steps of:
adding one of error detection code and error correction code to data and outputting resultant data when a part of the data to which one of the error detection code and the error correction code has been added is rewritten;
pre-obtaining a syndrome when the part of the data is rewritten;
obtaining a syndrome corresponding to one of the error detection code and the error correction code when the data is reproduced; and
detecting whether an error occurs corresponding to the obtained syndrome and the pre-obtained syndrome.

50. The data outputting and reproducing method as set forth in claim 49,
wherein the detecting step is performed depending on one of whether the obtained syndrome is zero and whether the obtained syndrome matches the pre-obtained syndrome.

51. The data outputting and reproducing method as set forth in claim 50,
wherein when one of the obtained syndrome is zero and the obtained syndrome matches the pre-obtained syndrome the result of the detecting step represents that no error occurs.

52. The data outputting and reproducing method as set forth in claim 50,
wherein when one of the obtained syndrome is zero and the obtained syndrome does not match the pre-obtained syndrome the result of the detecting step represents that the error occurs.

53. The data outputting and reproducing method as set forth in claim 49,
wherein the detecting step is performed corresponding to the data, the pre-obtained syndrome, and the obtained syndrome.

54. The data outputting and reproducing method as set forth in claim 49,
wherein when the part of the data is rewritten the detecting step is performed corresponding to the rewritten portion of the data, the pre-obtained syndrome, and the obtained syndrome.

55. The data outputting and reproducing method as set forth in claim 49,
wherein when the result of the detecting step represents that the error occurs the data are prohibited from being re-output.

56. The data outputting and reproducing method as set forth in claim 49,
wherein when the result of the detecting step represents that no error occurs the data are permitted to be re-output.

* * * * *